US010985750B2

(12) United States Patent
Joly et al.

(10) Patent No.: US 10,985,750 B2
(45) Date of Patent: Apr. 20, 2021

(54) METHOD FOR BIASING A DIFFERENTIAL PAIR OF TRANSISTORS, AND CORRESPONDING INTEGRATED CIRCUIT

(71) Applicant: STMicroelectronics (Rousset) SAS, Rousset (FR)

(72) Inventors: Yohan Joly, Meyreuil (FR); Vincent Binet, Aix en Provence (FR); Michel Cuenca, Septemes les Vallons (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/885,737

(22) Filed: May 28, 2020

(65) Prior Publication Data

US 2020/0395932 A1    Dec. 17, 2020

(30) Foreign Application Priority Data

Jun. 11, 2019   (FR) ...................... 1906167

(51) Int. Cl.
*H03K 17/56*   (2006.01)
*H03F 3/45*    (2006.01)

(52) U.S. Cl.
CPC ......... *H03K 17/56* (2013.01); *H03F 3/45076* (2013.01)

(58) Field of Classification Search
None
See application file for complete search history.

(56) References Cited

U.S. PATENT DOCUMENTS

| 4,336,502 | A  | * | 6/1982 | Goto | H03F 3/4508 330/253 |
| 6,940,329 | B2 | * | 9/2005 | Tsai | H03K 5/2481 327/205 |
| 7,292,083 | B1 | * | 11/2007 | Wang | H03K 5/2472 327/205 |
| 7,420,410 | B2 | * | 9/2008 | Ohba | H03F 3/45183 330/253 |
| 7,973,569 | B1 |   | 7/2011 | Bashar | |
| 10,630,274 | B2 | * | 4/2020 | Joly | H03F 3/45192 |
| 2009/0206806 | A1 |   | 8/2009 | Kamatani | |

FOREIGN PATENT DOCUMENTS

JP    2004194124 A    7/2004

* cited by examiner

*Primary Examiner* — Jeffrey S Zweizig
(74) *Attorney, Agent, or Firm* — Slater Matsil, LLP

(57) ABSTRACT

An integrated circuit includes at least one differential pair of transistors, a bias current generator that is configured to generate a bias current on a bias node that is coupled to a source terminal of each transistor of said differential pair by a respective resistive element. A compensation current generator is configured to generate a compensation current in one of the two resistive elements so as to compensate for a difference between actual values of the threshold voltages of the transistors of said differential pair.

24 Claims, 2 Drawing Sheets

METHOD FOR BIASING A DIFFERENTIAL PAIR OF TRANSISTORS, AND CORRESPONDING INTEGRATED CIRCUIT

CROSS-REFERENCE TO RELATED APPLICATIONS

This application claims priority to French Application No. 1906167, filed on Jun. 11, 2019, which application is hereby incorporated herein by reference.

TECHNICAL FIELD

Embodiments and implementations relate to integrated circuits, in particular to integrated circuits comprising a differential pair of MOS transistors.

BACKGROUND

Integrated comparator and amplifier devices typically include a differential pair of MOS transistors that are biased by a bias current. The respective conduction of the transistors, controlled by respective input signals, allows the difference in the input voltages to be compared or amplified.

In a comparator, the transistors must respond in an identical manner to ensure that the comparison is accurate. The threshold voltages of the transistors of the differential pair must therefore be equal. In practice, the actual threshold voltages of the transistors systematically exhibit variations between them, due to manufacturing contingencies.

Additionally, hysteresis is added to the control of the differential pair so as to avoid unwanted comparisons being triggered by noise.

In amplifiers, an offset between the threshold voltages may result in significant differences between the input and the output (for example in an operational amplifier in follower or programmable-gain mode); the difference between the threshold voltages must therefore be as small as possible.

Conventional techniques for compensating for an offset between the threshold voltages involve varying the resistive value of a resistive element coupled between the sources of each transistor in the pair and a bias node over which the bias current is drawn.

Additionally, conventional techniques for introducing a hysteresis offset involve adjusting the conductivity of the transistors by connecting multiple identical transistors in parallel, the coupling of which is controlled by a same number of switches.

To decrease the size of the structures providing hysteresis, French patent application FR1854562 proposes implementing both the compensation for the offset in the threshold voltages and the hysteresis offset by controlling and calibrating controllable resistive elements, which are coupled to the bias node.

However, the compensation is achieved by passing the bias current through the resistive elements, and is therefore dependent on the behaviour of the bias current. In particular, a current exhibiting variations in temperature that are complementary to those of the bias current is typically provided so that the compensation for the offset remains constant.

Moreover, the smaller the increments by which the controllable resistive elements can be adjusted, the larger the area occupied by the resistive elements, and the higher the parasitic capacitance introduced by the adjuster switches.

Additionally, the greater the amplitude of possible compensations, the greater the difference between the source voltages of the transistors and the bias node.

The above drawbacks negatively affect the performance of the differential pair, in particular when transitioning from an n-type differential pair to a p-type differential pair and vice versa, and in terms of input voltage dynamics, and are present regardless of the adjusted compensation value.

It is desirable for these drawbacks to be overcome.

SUMMARY

According to implementations and embodiments, what is proposed is an independent, adjustable, temperature-stable structure, with low capacitance and a small voltage difference on the bias node of the differential pair, for compensating for an offset in the values of the threshold voltages of the transistors of the pair and to introduce hysteresis.

According to one aspect, what is proposed is a method for biasing at least one differential pair of transistors in an integrated circuit, comprising:

an operation of generating a bias current on a bias node that is coupled to a source terminal of each transistor of said differential pair by a respective resistive element;

an operation of generating a compensation current in one of the two resistive elements so as to compensate for a difference between actual values of the threshold voltages of the transistors of the differential pair.

Thus, unlike the conventional methods in which it is the bias current that allows the difference in the actual threshold voltages to be compensated for, a compensation current is generated specifically for compensating for said difference, via one of the two resistive elements.

It is therefore the intensity of the compensation current that allows the compensation to be adjusted, rather than the resistive value of the resistive elements. Because of this, the drawbacks of the controllable resistive elements mentioned above are avoided. The two resistive elements are of course provided with an equal resistive value. The resistive element in which the compensation current is generated is of course chosen according to the offset to be compensated for.

According to one implementation, the method further comprises an operation of generating a hysteresis current in one of the two resistive elements, which operation is controlled by a hysteresis control signal so as to introduce a hysteresis offset between the actual values of the threshold voltages of the transistors of said differential pair of transistors.

In other words, a hysteresis current is generated specifically in order to introduce the hysteresis effect into the commands for the transistors of the differential pair, and analogously allows the constraints of the structures of the variable resistive elements to be avoided.

The resistive element channelling the hysteresis current is advantageously the resistive element that is coupled to the source of the transistor that is on in the stable state, according to the polarity of the differential inputs and according to the (n or p) conductivity type of the transistors of the differential pair.

According to one implementation, said operation of generating the hysteresis current comprises, in response to the hysteresis control signal, an operation of electrically coupling a hysteresis current injection branch and a hysteresis current extraction branch to each terminal, respectively, of said resistive element, and an operation of injecting the hysteresis current into the hysteresis current injection branch and an operation of extracting the hysteresis current from the hysteresis current extraction branch.

In this way, the hysteresis current, which is for generating the hysteresis voltage across the terminals of the resistive element, is well controlled and does not interfere with the bias current.

For example, said operation of generating the hysteresis current comprises an operation of transmitting the hysteresis current through said hysteresis current injection and extraction branches using respective current mirror circuits.

Thus, the generation of the current may be adjusted advantageously, for example in small increments and using a structure introducing a parasitic capacitance, without suffering the effect of said parasitic capacitance on the conduction terminals of the transistors of the differential pair and hence on the performance of said pair.

Said operation of generating the hysteresis current may thus generate the hysteresis current at an intensity that is controlled by the hysteresis control signal. For example, the hysteresis control signal is a digital signal, comprising both a command for setting hysteresis and the value of the offset in small increments.

According to one implementation, said operation of generating the compensation current comprises an operation of injecting the compensation current into a compensation current injection branch and an operation of extracting the compensation current from a compensation current extraction branch, said compensation current injection and extraction branches being coupled, respectively, to the terminals of one of the two resistive elements.

For example, the choice of the intensity of the compensation current and the choice of one or the other of said two resistive elements, to the terminals of which said compensation current injection and extraction branches are coupled, are made during the production of the differential pair of transistors according to the resistive value of the resistive elements and according to the difference between the actual values of the threshold voltages of the transistors of the differential pair.

For example, said operation of generating the compensation current comprises an operation of transmitting the compensation current through said compensation current injection and extraction branches using respective current mirror circuits.

Similarly, the generation of the compensation current may be adjusted for example in small increments, without suffering the effect of parasitic capacitance on the conduction terminals of the transistors of the differential pair.

According to one implementation, said hysteresis current and/or said compensation current are/is transmitted using the respective current mirror circuits on the basis of a reference current that is generated upstream of the respective current mirror circuits, and the method further comprises an operation of adjusting the intensity of the reference current in order to adjust the intensity of the hysteresis current and/or in order to adjust the intensity of the compensation current.

This implementation makes it possible to benefit from an additional parameter allowing in particular the fineness of the variation in the control of the intensity of the hysteresis current and/or the fineness of the variation in the choice of the intensity of the compensation current to be configured.

According to another aspect, what is proposed is an integrated circuit including at least one differential pair of transistors, a bias current generator that is configured to generate a bias current on a bias node that is coupled to a source terminal of each transistor of said differential pair by a respective resistive element, and a compensation current generator that is configured to generate a compensation current in one of the two resistive elements so as to compensate for a difference between actual values of the threshold voltages of the transistors of said differential pair.

According to one embodiment, the integrated circuit further includes a hysteresis current generator that is configured to generate a hysteresis current in one of the two resistive elements in response to a hysteresis control signal so as to introduce a hysteresis offset into the actual values of the threshold voltages of the transistors of said differential pair of transistors.

According to one embodiment, said hysteresis current generator is configured, in response to the hysteresis control signal, to electrically couple a hysteresis current injection branch and a hysteresis current extraction branch to each terminal, respectively, of said resistive element, and to inject the hysteresis current into said hysteresis current injection branch and to extract the hysteresis current from said hysteresis current extraction branch.

According to one embodiment, said hysteresis current generator comprises current mirror circuits that are configured to transmit the hysteresis current through said hysteresis current injection and extraction branches.

According to one embodiment, said hysteresis current generator is configured to generate the hysteresis current at an intensity that is controlled by the hysteresis control signal.

According to one embodiment, said compensation current generator comprises a compensation current injection branch and a compensation current extraction branch that are coupled, respectively, to the terminals of one of the two resistive elements, and is configured to inject the compensation current into the compensation current injection branch and to extract the compensation current from the compensation current extraction branch.

According to one embodiment, the intensity of the compensation current and said one of the two resistive elements, to the terminals of which said compensation current injection and extraction branches are coupled, are chosen according to the resistive value of the resistive elements and according to the difference between the actual values of the threshold voltages of the transistors of the differential pair.

According to one embodiment, said compensation current generator comprises respective current mirror circuits that are configured to transmit the compensation current through said compensation current injection and extraction branches.

According to one embodiment, said respective current mirror circuits are configured to transmit said hysteresis current and/or said compensation current on the basis of a reference current that is generated by a reference current generator that is coupled upstream of the respective current mirror circuits, the reference current generator being configured to generate the reference current at an intensity that is chosen to adjust the intensity of the hysteresis current and/or to adjust the intensity of the compensation current.

The integrated circuit may comprise an amplifier or a comparator incorporating said at least one differential pair.

BRIEF DESCRIPTION OF THE DRAWINGS

Other advantages and features of the invention will become apparent on examining the detailed description of embodiments and implementations, and the appended drawings, in which.

DETAILED DESCRIPTION OF ILLUSTRATIVE EMBODIMENTS

Figure 1:
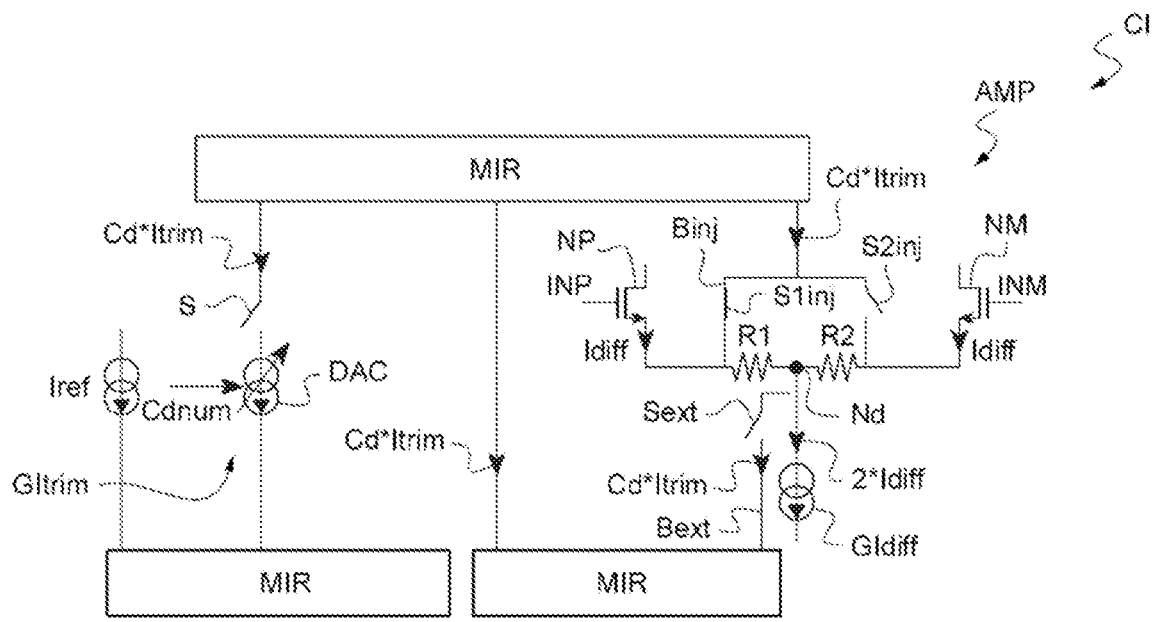
FIG. 1 illustrates one embodiment of the invention.

FIG. 1 shows an exemplary integrated circuit CI including an amplifier AMP incorporating a differential pair of transistors NP, NM.

Each transistor NP, NM of the differential pair is controlled by a respective input signal INP, INM on its gate. The transistor NP is located at a positive input INP and the transistor NM at a negative input INM.

The sources of the transistors NP, NM of the differential pair are connected to a bias node Nd via a respective resistive element R1, R2. The resistive elements R1, R2 have the same resistive value.

The drains of the transistors NP, NM each form a respective output of the differential pair.

The integrated circuit CI includes a bias current generator GIdiff that is configured to generate a bias current 2*Idiff, which is applied to the bias node Nd.

Thus, the transistors NP, NM are biased in a balanced manner and each channel the same differential current Idiff. The output voltages on the drains of the transistors vary according to the conduction of the respective transistor NP, NM according to the input signal INP, INM.

In order for the differential output signals to be precisely representative of a difference between the input signals, it is important for the two transistors NP, NM of the differential pair to behave in the same way. However, during the production of an integrated circuit, the characteristics of the transistors, in particular the threshold voltage, may vary slightly due to unpredictable physical contingencies.

The integrated circuit CI includes a compensation current generator GItrim that is configured to generate a compensation current Cd*Itrim, and to channel it into one of the two resistive elements R1, R2 so as to compensate for a difference between actual values of the threshold voltages of the transistors of said differential pair NP, NM.

A first injection switch S1inj allows a compensation current injection branch Binj to be connected to the resistive element R1, on the side of the source of the transistor NP of the positive input INP.

A second injection switch S2inj allows a compensation current injection branch Binj to be connected to the resistive element R2, on the side of the source of the transistor NM of the negative input INM.

A compensation current extraction branch Bext is connected to the other terminal of one or the other of the resistive elements R1 or R2, i.e. to the bias node Nd. An extraction switch Sext allows the extraction branch Bext to be disconnected if no compensation is desired.

The compensation current generator GItrim is configured to inject the compensation current Cd*Itrim into the compensation current injection branch Binj and to extract the compensation current Cd*Itrim from the compensation current extraction branch Bext.

Thus, a path for channelling the compensation current Cd*Itrim is formed across the terminals of one of the two resistive elements R1, R2, as desired, and the channelling of the compensation current Cd*Itrim has no effect on the dynamics of the bias current 2*Idiff.

Furthermore, if for example the transistor NP of the positive input INP exhibits a threshold voltage that is slightly lower than the threshold voltage of the transistor NM of the negative input INM, then the compensation current Cd*Itrim is channelled into the resistive element R1 that is coupled to the transistor NP via the closed first injection switch S1inj and the closed extraction switch Sext.

A voltage Cd*Itrim*R1 is generated across the terminals of the resistor R1 and increases the source voltage of the transistor NP by the same value. A slightly higher input signal, Cd*Itrim*R1, on the positive input INP will thus control the transistor NP as if its threshold voltage were slightly higher (i.e. than the expected value).

The equation governing this equilibrium is as follows:

$$INP-Vgsp-(Cd*Itrim+Idiff)*R=INM-Vgsm-Idiff*R;$$

where INP and INM are the voltages of the respective inputs, Vgsp is the gate-source voltage of the transistor NP, Vgsm is the gate-source voltage of the transistor NM, Cd*Itrim is the compensation current, Idiff is the differential current and R is the resistive value of the resistive elements R1 and R2;

and, for the same input voltage INP=INM, $$Vgsm=Vgsp+Cd*Itrim*R.$$

Where Cd is an integer code that may be controlled and Itrim is a fixed elementary compensation current, there is a voltage increment that is equal to Itrim*R in order to compensate for a potential offset between the threshold voltages of the transistors NP, NM.

It is thus possible to size the intensity of the elementary compensation current Itrim according to the resistive value R in order to have an increment of greater or lesser size.

For example, to have an increment of 1 mV, where R=1Ω, a current Itrim of 1 µA is generated; or, where R=100Ω, a current Itrim of 10 µA is generated. The code Cd makes it possible to calibrate the compensation for the threshold voltages to Cd*1mV according to the difference to be compensated for between the actual values of the threshold voltages of the transistors of the differential pair NP, NM.

Of course, the resistive value R of the resistive elements R1, R2 may differ from the examples above, and the increment Itrim*R may also be chosen to be different.

The intensity value of the elementary current Itrim and the resistive value R are chosen before the transistors NP, NM of the differential pair are produced.

The code Cd and the injection switch to be closed are, for their part, chosen during a phase of characterizing the components in the production of the integrated circuit according to the difference between the values of the threshold voltages of the transistors NP, NM that are obtained in production.

In the example described here, the compensation current generator GItrim comprises a controllable current generator DAC. The controllable current generator DAC is for example capable of receiving a digital command Cdnum that parametrizes a gain on a reference current Iref so that the compensation current Cd*Itrim is delivered at a controlled intensity.

The reference current Iref is generated by a reference current generator upstream of current mirror circuits MIR and of the compensation current generator GItrim.

The current mirror circuits MIR are configured to transmit the compensation current Cd*Itrim through said compensation current injection and extraction branches Binj, Bext, respectively.

An effect of the current mirror circuits MIR is to isolate the parasitic capacitance that may be introduced, by the controllable current generator DAC, into the circuit of the differential pair of transistors NP, NM.

A switch S is connected at output of the controllable current generator DAC so as to disconnect it from the current mirrors MIR when no compensation is configured.

Figure 2:
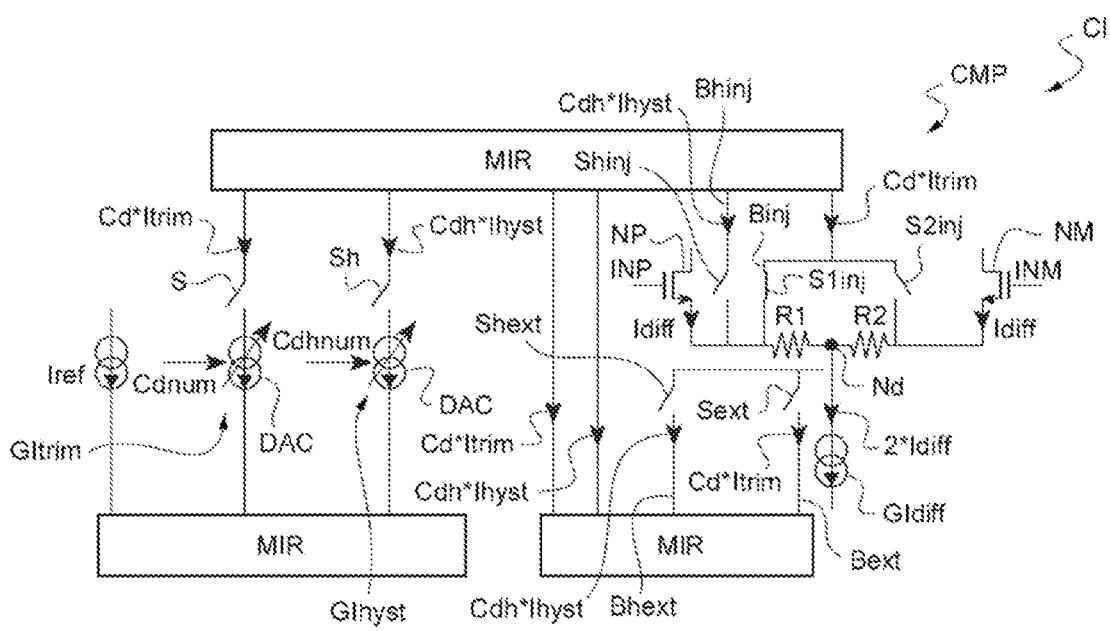
FIG. 2 illustrates one embodiment of the invention.

FIG. 2 illustrates an exemplary integrated circuit CI including a comparator device CMP incorporating a differential pair of transistors NP, NM.

The circuit of the comparator CMP includes the circuit described with reference to FIG. 1 of the operational amplifier AMP. The same elements bear the same references and will not be described in detail again here.

In addition to the compensation current generator GItrim, the comparator CMP includes a hysteresis current generator GIhyst.

The hysteresis current generator GIhyst is configured to generate a hysteresis current Cdh*Ihyst in the resistive element R1 that is coupled to the source of the transistor NP, which is on in the stable state, according to the polarity of the differential inputs INP, INM and according to the n or p conductivity type of the transistors of the differential pair.

In other words, the transistor that is coupled to the positive input INP for an n-type pair of transistors and the transistor that is coupled to the negative input INM for a p-type pair of transistors.

The hysteresis current Cdh*Ihyst thus introduces a hysteresis offset into the actual values of the threshold voltages of the transistors of said differential pair of transistors NP, NM.

The hysteresis current generator GIhyst is configured to be controlled by a hysteresis command Cmdh. The hysteresis command is generally issued from the output of the comparator CMP (not shown), which is representative of a comparison stable state.

Furthermore, in a manner that is analogous to the injection-extraction of the compensation current Cd*Itrim, the hysteresis current generator GIhyst is configured to electrically couple a hysteresis current injection branch Bhinj and a hysteresis current extraction branch Bhext to each terminal of said resistive element R1.

The hysteresis command Cmdh controls a switch Shinj on the hysteresis current injection branch Bhinj and a switch Shext on the hysteresis current extraction branch Bhext.

The hysteresis current Cdh*Ihyst may thus be injected into the hysteresis current injection branch Bhinj and be extracted from said hysteresis current extraction branch Bhext.

In this way, a hysteresis offset voltage, equal to Cdh*Ihyst*R1, is generated across the terminals of the resistive element R1.

Like for generating the compensation current Cd*Itrim, the hysteresis current generator GIhyst comprises a controllable current generator DAC capable of receiving a digital command Cdnum that parametrizes a gain on the reference current Iref, generated upstream of the current mirror circuits MIR and of the hysteresis current generator, so that the hysteresis current Cdh*Ihyst is delivered at a desired intensity.

Respective current mirror circuits MIR are also configured to transmit the hysteresis current Cdh*Ihyst through said hysteresis current injection and extraction branches Bhinj, Bhext.

A switch Sh is connected at output of the controllable current generator DAC so as to disconnect it from the current mirrors MIR if the hysteresis is not ordered.

Where Cdh is an integer code that may be controlled and Ihyst is a fixed elementary hysteresis current, there is a voltage increment that is equal to Ihyst*R in order to introduce a hysteresis into the input voltages INP, INM of the differential pair.

It is thus also possible to size the intensity of the elementary hysteresis current Ihyst according to the resistive value R in order to have an increment of greater or lesser size so as to regulate the hysteresis offset.

For example, to have a hysteresis increment of 10 mV, where R=1 kΩ, a current Ihyst of 10 μA is generated; or, where R=100Ω, a current Ihyst of 100 μA is generated. The code Cdh therefore makes it possible to parametrize the hysteresis voltage to Cdh*10mV.

For example, the digital command Cdhnum is contained in the hysteresis control signal Cmdh so as to be able to parametrize the value of the hysteresis voltage to the use.

Furthermore, the reference current generator generating the reference current Iref may be configured to generate the reference current Iref at an intensity that may be chosen, for example during the design of the integrated circuit CI or potentially on command during use of the integrated circuit.

Given that the generation of the compensation current Cd*Itrim and of the hysteresis current Cdh*Ihyst each result in a gain applied to the reference current Iref, choosing an intensity for the reference current Iref may make it possible in particular to adjust the increment at which the intensity of the hysteresis current is controlled and the increment at which the intensity of the compensation current may be chosen.

Figure 3:
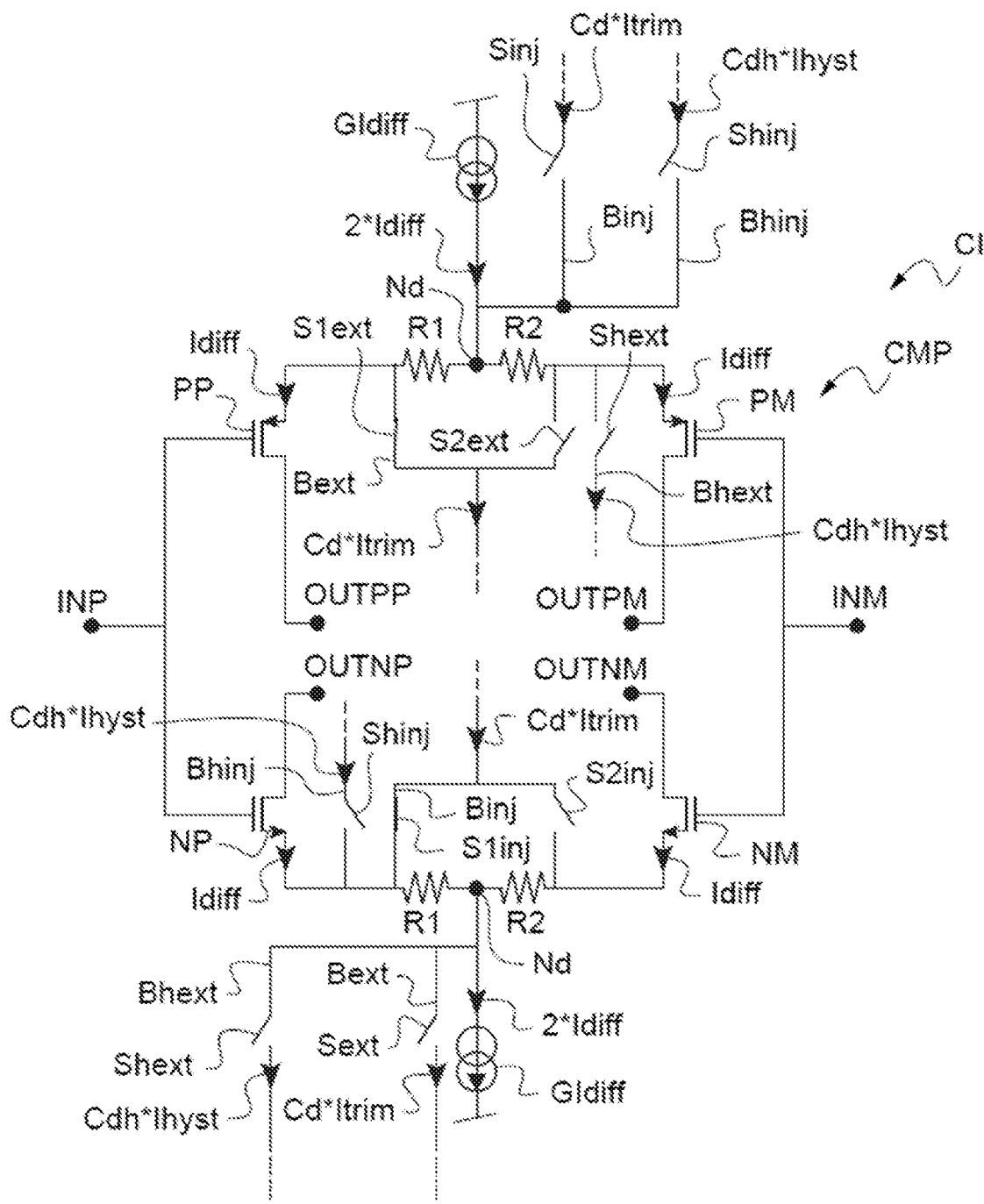
FIG. 3 illustrates one embodiment of the invention.

FIG. 3 shows the comparator CMP of the exemplary integrated circuit CI described above with reference to FIG. 2, including a second differential pair of transistors PP, PM.

The transistors NP, NM of the first differential pair described above with reference to FIG. 2 exhibit n-type conductivity while the transistors PP, PM of the second differential pair exhibit p-type conductivity.

In the second differential pair PP, PM, the compensation current generator GItrim is configured so as to be symmetrical to the layout in the first differential pair NP, NM.

Thus, the compensation current generator GItrim comprises a compensation current injection branch Binj and a compensation current extraction branch Bext that are coupled, respectively, to the terminals of one of the two resistive elements R1, R2 by means of respective switches S1ext, S2ext. The compensation current Cd*Itrim is injected into the compensation current injection branch Binj and is extracted from the compensation current extraction branch Bext.

However, in the second differential pair PP, PM, the switches S1ext, S2ext coupling the compensation current injection-extraction path Binj, Bext with one or the other of the two resistive elements R1, R2 on the side of the source of the respective transistor PP, PM are located on the compensation current extraction branch Bext.

The compensation current injection branch Binj is coupled to the bias node Nd, also via an injection switch Sinj.

Similarly, in the second differential pair PP, PM, the hysteresis current generator GIhyst is configured so as to be symmetrical to the layout in the first differential pair NP, NM.

Thus, the hysteresis current generator GIhyst is configured, in response to the hysteresis control signal Cmdh, to electrically couple a hysteresis current injection branch Bhinj and a hysteresis current extraction branch Bhext to each terminal, respectively, of said resistive element R1 by means of respective switches Shinj, Shext.

The hysteresis current Cdh*Ihyst may thus be injected into said hysteresis current injection branch Bhinj and be extracted from said hysteresis current extraction branch Bhext.

As mentioned above, the hysteresis current Cdh*Ihyst is generated in the resistive element R2 that is coupled to the source of the transistor PM, which is on in the stable state, i.e. the transistor that is coupled to the negative input INM for the second differential pair of transistors, the conductivity type of which is p-type.

The current mirrors MIR described above with reference to FIG. 2 may advantageously be shared for the compensation and hysteresis currents of the two differential pairs.

The exemplary integrated circuits CI described above with reference to FIGS. 1 to 3 advantageously make it possible to compensate for a threshold voltage offset between transistors in a differential pair and, if applicable, to introduce a hysteresis offset into the inputs of a comparator.

In the above exemplary integrated circuits, the voltage between the sources of the transistors and the bias node is minimal and, in particular because of a limited number of switches connected to the differential pair, the parasitic capacitance is also minimal.

Furthermore, the compensation and the hysteresis do not depend on the bias current, and may thus be configured optimally, for example relative to variations in temperature and also with small increments, and may furthermore be adjusted via the generation of the reference current Iref.

What is claimed is:

1. A method for biasing at least one differential pair of transistors in an integrated circuit, the method comprising:
   generating a bias current on a bias node that is coupled to a source terminal of each transistor of the at least one differential pair by a respective resistive element; and
   generating a compensation current in a first resistive element of the two resistive elements so as to compensate for a difference between actual values of threshold voltages of the transistors of the at least one differential pair.

2. The method according to claim 1, further comprising:
   generating a hysteresis current in a second resistive element of the two resistive elements using a hysteresis control signal so as to introduce a hysteresis offset between the actual values of the threshold voltages of the transistors of the at least one differential pair of transistors.

3. The method according to claim 2, wherein the first and second resistive elements have a same resistive value.

4. The method according to claim 2, wherein generating the hysteresis current comprises, in response to the hysteresis control signal:
   electrically coupling a hysteresis current injection branch and a hysteresis current extraction branch to each terminal, respectively, of the second resistive element;
   injecting the hysteresis current into the hysteresis current injection branch; and
   extracting the hysteresis current from the hysteresis current extraction branch.

5. The method according to claim 4, wherein generating the hysteresis current comprises transmitting the hysteresis current through the hysteresis current injection and extraction branches using respective current mirror circuits.

6. The method according to claim 5, further comprising:
   transmitting the hysteresis current using the respective current mirror circuits based on a reference current that is generated upstream of the respective current mirror circuits; and
   adjusting an intensity of the reference current in order to adjust an intensity of the hysteresis current.

7. The method according to claim 2, wherein generating the hysteresis current comprises generating the hysteresis current at an intensity that is controlled by the hysteresis control signal.

8. The method according to claim 1, wherein generating the compensation current comprises:
   injecting the compensation current into a compensation current injection branch; and
   extracting the compensation current from a compensation current extraction branch, the compensation current injection and extraction branches being coupled, respectively, to terminals of the first resistive element of the two resistive elements.

9. The method according to claim 8, wherein generating the compensation current comprises transmitting the compensation current through the compensation current injection and extraction branches using respective current mirror circuits.

10. The method according to claim 9, further comprising:
    transmitting the compensation current using the respective current mirror circuits based on a reference current that is generated upstream of the respective current mirror circuits; and
    adjusting an intensity of the reference current in order to adjust an intensity of the compensation current.

11. The method according to claim 10, wherein an intensity of the compensation current and the first resistive element of the two resistive elements, to the terminals of which the compensation current injection and extraction branches are coupled, are selected during manufacture of the at least one differential pair of transistors according to a resistive value of the two resistive elements and according to the difference between the actual values of the threshold voltages of the transistors of the at least one differential pair.

12. An integrated circuit comprising:
    at least one differential pair of transistors;
    a bias current generator configured to generate a bias current on a bias node that is coupled to a source terminal of each transistor of the at least one differential pair by a respective resistive element; and
    a compensation current generator configured to generate a compensation current in a first resistive element of the two resistive elements so as to compensate for a difference between actual values of threshold voltages of the transistors of the at least one differential pair.

13. The integrated circuit according to claim 12, further comprising a hysteresis current generator configured to generate a hysteresis current in a second resistive element of the two resistive elements in response to a hysteresis control signal so as to introduce a hysteresis offset into the actual values of the threshold voltages of the transistors of the at least one differential pair of transistors.

14. The integrated circuit according to claim 13, wherein the first and second resistive elements have a same resistive value.

15. The integrated circuit according to claim 13, wherein the hysteresis current generator is configured, in response to the hysteresis control signal, to electrically couple a hysteresis current injection branch and a hysteresis current extraction branch to each terminal, respectively, of the second resistive element, and to inject the hysteresis current into the hysteresis current injection branch and to extract the hysteresis current from the hysteresis current extraction branch.

16. The integrated circuit according to claim 15, wherein the hysteresis current generator comprises respective current mirror circuits that are configured to transmit the hysteresis current through the hysteresis current injection and extraction branches.

17. The integrated circuit according to claim 16, wherein the respective current mirror circuits are configured to transmit the hysteresis current based on a reference current that is generated by a reference current generator that is coupled upstream of the respective current mirror circuits, wherein the reference current generator is configured to generate the reference current at an intensity that is selected to adjust an intensity of the hysteresis current.

18. The integrated circuit according claim 13, wherein the hysteresis current generator is configured to generate the hysteresis current at an intensity that is controlled by the hysteresis control signal.

19. The integrated circuit according to claim 12, wherein the compensation current generator comprises a compensation current injection branch and a compensation current extraction branch that are coupled, respectively, to terminals of the first resistive element of the two resistive elements, and is configured to inject the compensation current into the compensation current injection branch and to extract the compensation current from the compensation current extraction branch.

20. The integrated circuit according to claim 19, wherein the compensation current generator comprises respective current mirror circuits that are configured to transmit the compensation current through the compensation current injection and extraction branches.

21. The integrated circuit according to claim 20, wherein the respective current mirror circuits are configured to transmit the compensation current based on a reference current that is generated by a reference current generator that is coupled upstream of the respective current mirror circuits, wherein the reference current generator is configured to generate the reference current at an intensity that is chosen to adjust an intensity of the compensation current.

22. The integrated circuit according to claim 21, wherein the intensity of the compensation current and the first resistive element of the two resistive elements, to the terminals of which the compensation current injection and extraction branches are coupled, are selected according to a resistive value of the two resistive elements and according to the difference between the actual values of the threshold voltages of the transistors of the at least one differential pair.

23. The integrated circuit according to claim 12, further comprising an amplifier incorporating the at least one differential pair.

24. The integrated circuit according to claim 12, further comprising a comparator incorporating the at least one differential pair.

* * * * *